United States Patent
Bordes et al.

(10) Patent No.: US 7,155,657 B2
(45) Date of Patent: Dec. 26, 2006

(54) DEVICE AND METHOD FOR INSERTING ERROR CORRECTING CODES AND FOR RECONSTRUCTING DATA STREAMS, AND CORRESPONDING PRODUCTS

(75) Inventors: Philippe Bordes, Laille (FR); Edouard François, Bourg des Comptes (FR); Philippe Guillotel, Vern sur Seiche (FR); Thierry Kerber, Paris (FR)

(73) Assignee: Thomson Licensing, Boulogne-Billancourt (FR)

( * ) Notice: Subject to any disclaimer, the term of this patent is extended or adjusted under 35 U.S.C. 154(b) by 478 days.

(21) Appl. No.: 10/383,454

(22) Filed: Mar. 6, 2003

(65) Prior Publication Data

US 2004/0015768 A1   Jan. 22, 2004

(30) Foreign Application Priority Data

Mar. 15, 2002   (FR) .................................. 02 03196

(51) Int. Cl.
*H03M 13/35* (2006.01)
(52) U.S. Cl. ........................ 714/774; 714/776
(58) Field of Classification Search ................ 714/774, 714/776; *H03M 13/35*
See application file for complete search history.

(56) References Cited

U.S. PATENT DOCUMENTS

| | | | |
|---|---|---|---|
| 6,317,462 B1 * | 11/2001 | Boyce .................... | 375/240.27 |
| 6,754,277 B1 * | 6/2004 | Heinzelman et al. .. | 375/240.27 |
| 6,910,175 B1 * | 6/2005 | Krishnamachari .......... | 714/774 |
| 6,965,636 B1 * | 11/2005 | DesJardins et al. ......... | 714/774 |
| 2002/0012360 A1 * | 1/2002 | Olivieri et al. ............. | 370/473 |
| 2002/0021761 A1 * | 2/2002 | Zhang et al. ........... | 375/240.27 |
| 2002/0031122 A1 * | 3/2002 | Martini et al. .............. | 370/389 |
| 2002/0034225 A1 * | 3/2002 | Martini et al. ......... | 375/240.01 |
| 2002/0157058 A1 * | 10/2002 | Ariel et al. ................. | 714/774 |
| 2004/0030983 A1 * | 2/2004 | Tomita ....................... | 714/776 |

FOREIGN PATENT DOCUMENTS

EP           936772 A2  *  8/1999

* cited by examiner

*Primary Examiner*—R. Stephen Dildine
(74) *Attorney, Agent, or Firm*—Joseph J. Laks; Ronald H. Kurdyla; Joel M. Fogelson

(57) ABSTRACT

Device and method for inserting error correcting codes and for reconstructing data streams, and corresponding products The present invention relates to a device (1) for inserting error correcting codes into data streams (11) intended to be sent in packets in a network (8), a device (9) for reconstructing data streams (13), and corresponding methods and products.

The insertion device comprises a unit (3) for identifying resynchronization indicators dispersed in the data streams and a unit (4) for determining successive segments in these streams, the segments forming partitions of the data lying between two consecutive resynchronization indicators. It also comprises a unit (6) for allocating a set of error correcting codes to each of these segments, these sets of codes having decreasing sizes between any two of the consecutive resynchronization indicators. Preferably, the device also comprises a data interleaving unit (7).

15 Claims, 5 Drawing Sheets

DEVICE AND METHOD FOR INSERTING ERROR CORRECTING CODES AND FOR RECONSTRUCTING DATA STREAMS, AND CORRESPONDING PRODUCTS

BACKGROUND OF THE INVENTION

1. Field of the Invention

The present invention relates to devices and methods for inserting error correcting codes into data streams and for reconstructing data streams, as well as to corresponding products.

2. Discussion of the Background

The techniques for the continuous transmission of multimedia files, also known as "streaming", permit Internet surfers to read these files in real time during the transmission, without having to wait for them to be downloaded completely. To do this, the data of the files are conventionally chopped into small elements so as to be transported from a server to a client in packets of smaller size than a critical size. This size, usually denoted MTU_size, represents the maximum size that the network can transport. It is determined both by equipment or hardware considerations such as the physics of the network (asynchronous transfer mode, denoted ATM; Internet protocol or IP; wireless communication, etc.), and by software considerations (routers constituting the network).

In practice, owing to the heterogeneity both of the routers (with different capabilities) and of the traffic (Internet transmission control protocol or TCP; user datagram protocol or UDP . . . with bit rates which are highly variable over time), an Internet network is subject to local congestions which give rise in particular to packet losses.

At the level of the client, associated with a decoder, the loss of a packet results in a discontinuity or several discontinuities (in the event of the use of an interleaving technique) in the data which it receives.

The decoder must then resynchronize itself on special words of the binary train (otherwise known as bit stream), such as image headers or resynchronization markers if they are present, as is the case in video transmitted according to the MPEG4 compression standard. The addition of these latter markers strengthens the robustness to errors (otherwise known as error resilience), but adds extra throughput, also known as "overhead" (around 25 bytes). Thus, the efficiency of the coding is reduced, thereby leading to its use being restricted.

Hereinbelow, the expression "resynchronization indicators" will designate indicators inserted into the data stream, and serving to perform a synchronization, preferably during the decoding process, whether it be a change of time in the stream (as with image headers) or a synchronization within one and the same image (hence in the course of one and the same time instant, as with resynchronization markers).

The TCP protocol makes it possible to remedy the problem of packet loss, by systematically retransmitting the lost packets which are not acknowledged by the client. However, this protocol is hardly appropriate to video streaming, since it introduces unacceptable values of retransmission lags and jitter. The UDP protocol is therefore preferred to it.

To protect UDP streams against losses, a widespread technique consists in the use of error correcting codes with no return path, or FEC (standing for Forward Error Correction codes), with data interleaving. Such FECs may in particular consist of parity codes or Reed-Solomon codes. They introduce a predefined level of redundancy making it possible to reconstruct lost packets.

Two types of such error correcting techniques are distinguished:
 interleaving-based procedures with uniform protection or ELP-interleaved techniques (ELP standing for Equal Lost Protection), protecting each data packet uniformly,
 and interleaving-based procedures with variable protection or ULP-interleaved techniques (ULP standing for Unequal Lost Protection), protecting certain parts of the binary train more than others, depending on the type of data of the packets.

Another kind of method with variable protection is disclosed in document EP-A-0,936,772, which describes a ULP protection technique for audio coders. According to its teaching, n distinct classes are distinguished among the audio data, based on error sensitivity, that is, the impact of errors in those data, on the perceived quality of a reconstructed audio signal. A different level of error protection is allocated to each of the data classes. For example, in each data packet, one distinguishes bits related to side channels and bits related to a center channel for the stereo separation of the signal, or otherwise bits associated with predefined frequency ranges.

That method relies on a fine distinction of the belonging classes for the various bits of the audio information stream, which is implemented by means of a classifier able to distribute the data and to enable the definition of an error protection profile. That profile is then transmitted as control information to receivers.

However, reconstructions of part of the lost packets turn out to lead to a utilizable data size which is smaller than that which might be expected.

Specifically, when packets are rebuilt without it being possible to synchronize them appropriately, these packets are generally unusable. To reduce the risks of losing resynchronization indicators (such as image headers or resynchronization markers), it is possible to apply the ULP-interleaved procedure while granting a higher level of protection to these indicators. The efficiency of the reconstructions nevertheless remains restricted, since any interruption in the chain of synchronized packets undermines the succeeding packets, until the next resynchronization indicator.

The additional application of a variable protection by means of a fine distinction between various kinds of data in each packet, as described in document EP-A-0,936,772, would significantly increase the implementation complexity without solving that difficulty.

SUMMARY OF THE INVENTION

The present invention relates to a device for inserting error correcting codes into data streams, making it possible to increase the efficiency of the reconstructions, that is to say the mean size of data which can be utilized by a receiver, as compared with known ELP-interleaved and ULP-interleaved procedures.

The device of the invention can afford an appreciable improvement to the results, while being capable of offering precise control parameters making it possible to tailor the technique implemented according to the environment. It can be based on an architecture permitting the implementation of conventional streaming techniques for UDP type streams, without requiring complex development and complex implementation.

The invention also relates to a method of insertion having the advantages mentioned above, and to a corresponding data stream reconstruction device and method. It applies moreover to a digital signal and to a computer program.

Accordingly, the subject of the invention is a device for inserting error correcting codes into at least one data stream intended to be sent as packets in a network. Each of these streams includes resynchronization indicators dispersed in the stream and the data lying between any two of the consecutive resynchronization indicators constitute a data block. The device for inserting codes comprises:

a unit for determining successive data segments in the streams, and a unit for allocating a set of error correcting codes to each of these segments, preferably of the FEC codes type, these sets of codes having variable sizes depending on the segments.

According to the invention, the insertion device also comprises a unit for identifying the resynchronization indicators, the unit for determining segments is designed to determine the segments by performing partitions of said data blocks and the allocating unit is designed to assign decreasing sizes to the sets of codes between any two of the consecutive resynchronization indicators.

By stating that the sizes of the sets of codes are "decreasing" between any two of the consecutive resynchronization indicators of the relevant stream, which are referred to hereinbelow as the upstream and downstream resynchronization indicators respectively (two "consecutive" indicators being indicators immediately following each other, that is without intermediary indicator between both), it is meant that:

the size of the set of codes which is associated with the segment immediately downstream of the upstream resynchronization indicator is strictly greater than the size of the set of codes which is associated with the segment immediately upstream of the downstream resynchronization indicator, and the sizes of the sets of codes respectively associated with the consecutive segments of the data block lying between the upstream and downstream resynchronization indicators are non-increasing, hence are either constant, or strictly decreasing.

Thus, according to the invention, a variable protection level is applied to the data depending on their location in the stream: in each data block lying between two consecutive upstream and downstream resynchronization indicators, the closer the packets are to the upstream resynchronization indicator, the better they are protected ("better" possibly meaning a stationary protection level on certain parts). This embodiment contrasts unexpectedly with the known procedures of the ULP-interleaved type or other methods with variable protection (such as the one of document EP-A-0, 936,772), in which the protection level depends on the type of data.

Figure 1A:
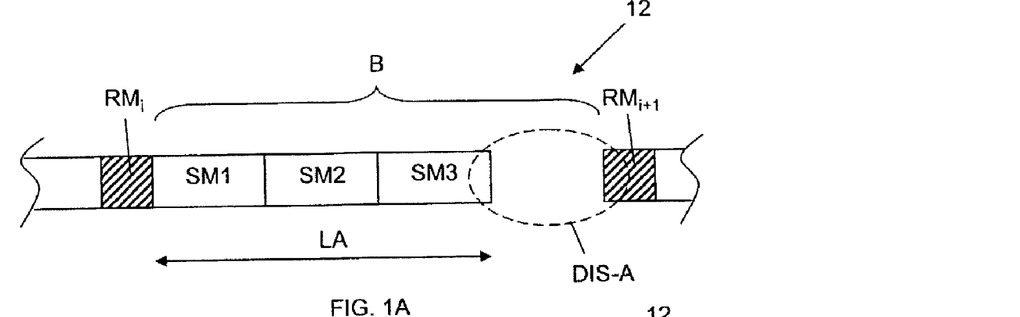
FIG. 1A is a basic diagram representing a data block between two consecutive resynchronization indicators, and the effect of the loss of a downstream segment of this block on the data which can actually be utilized.
Figure 1B:
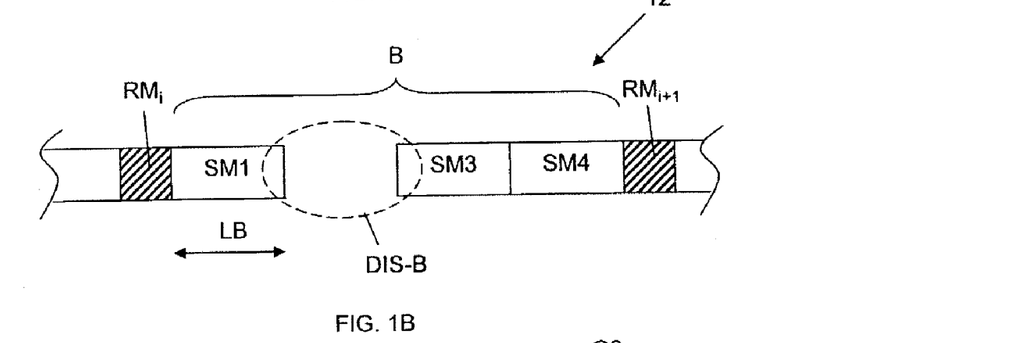
FIG. 1B shows the effect of the loss of an upstream segment of the block of FIG. 1A on the data which can actually be utilized.

The device of the invention makes it possible to allow for the more or less damaging consequences of the losing of packets, depending on their positions with respect to the resynchronization indicators. This is illustrated in FIGS. 1A and 1B, which diagrammatically represent a block B of data lying between two resynchronization markers, respectively upstream $RM_i$ and downstream $RM_{i+1}$, in a data stream 12.

The dimensions of the various entities represented in these figures are purely illustrative. By way of example, the block B is split into four consecutive data segments SM1, SM2, SM3 and SM4. The other blocks of the stream 12 are presumed to be constructed in a similar manner.

The loss of the last segment SM4 of block B (FIG. 1A), creating a discontinuity DIS-A, is not harmful to the other segments SM1, SM2 and SM3. Thus, the utilizable data have a length LA covering the majority of block B. On the other hand, the loss of the second segment SM2 (FIG. 1B), creating a discontinuity DIS-B, also makes the following segments SM3 and SM4 of block B unusable, since on reception, it is not possible to synchronize their content correctly. The utilizable data of block B are then reduced to the length LB of the segment SM1 alone, the only segment which can be correctly decoded.

Protection which decreases as a function of distance away from the upstream resynchronization indicator (in this instance the marker $RM_i$) thus appears to be especially judicious.

In addition to its unexpectedness, the device of the invention runs totally counter to a conventional approach to the issue. Specifically, as indicated above, the standard techniques for protecting data are based on interleaving the data packets (ELP-interleaved or ULP-interleaved procedures), which make it possible to considerably reduce the risks of joint losses of useful information and of redundancy information. Now, the straightforward application of conventional ULP interleaving to sizes of FEC codes varying as a function of the positions of the packets, not only does not lead to an improvement in the situation, but makes it worse.

Figure 2A:
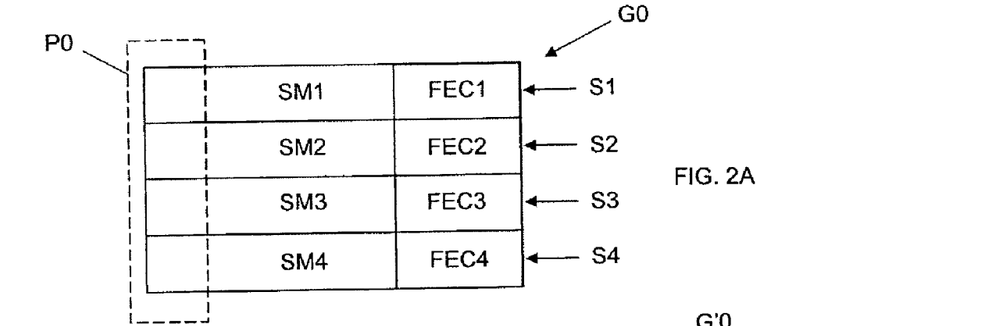
FIG. 2A illustrates the application of the ELP-interleaved procedure to a stream which includes the block of FIGS. 1A and 1B (partitioning into four segments)

By way of illustration, we may return to the previous example (with reference to FIGS. 1A and 1B) and consider the application of the ELP-interleaved procedure (FIG. 2A). The four segments SM1 . . . SM4 having the same size and being associated respectively with sets of FEC codes denoted FEC1 . . . FEC4, also of constant size, one defines sequences Sj each formed respectively of data associated with the segments SMj (and which are also denoted SMj for simplicity) and of the associated set of codes FECj, with j=1, 2, 3 or 4. These sequences Sj form a group G0, used for the interleaving. To construct the packets P0, of identical sizes, constant size portions of the sequences S1 to S4 are respectively juxtaposed.

In a ULP-interleaved version implementing variable levels of protection according to the parts of the block B (FIG. 2B), the known procedures in this field are transposed by defining sequences S'1 . . . S'4 of constant size so as to construct a group G'0. Each of them S'j is formed of data associated with a segment SM'j (and also denoted SM'j for simplicity) and of a set of FEC codes, denoted FEC'j, the sets FEC'j having a size decreasing as a function of distance away from the segments SM'j associated with the upstream marker RMi. Thus, the first set FEC'1 has the maximum size, the fourth FEC'4 has the minimum size, and the second and third sets FEC'2 and FEC'3 have an intermediate size. The data associated with the segments SM'j consequently have the opposite behavior.

Figure 2B:
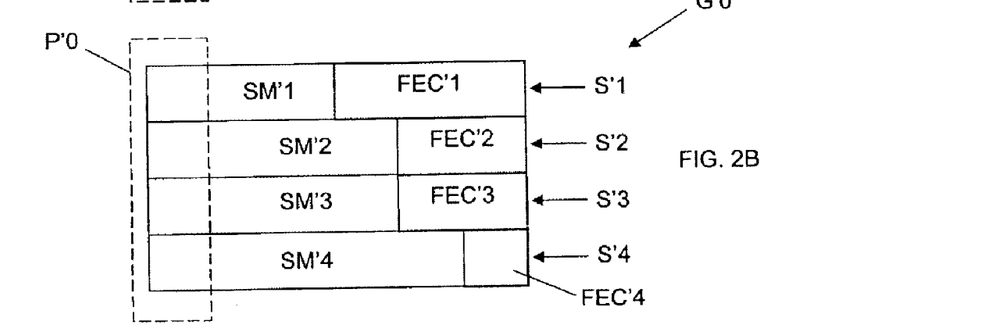
FIG. 2B illustrates the application of an interleaving procedure with FEC codes of variable sizes depending on the positions of the data with respect to resynchronization indicators, to a stream comprising the block of FIGS. 1A and 1B (partition into four segments)

Moreover, given that the block B is predefined, these segments SM'j constitute a new partition thereof, and their aggregate size is therefore the same as that of the segments SMj of the ELP-interleaved procedure. What is more, in order to be able to correctly compare the ELP and ULP techniques, the same total volume of FEC codes is employed for block B in both cases. In practice, one merely transfers a portion of protection designed for the fourth segment to the first segment. As for the ELP-interleaved procedure, packets P'0 are then constructed by juxtaposing constant size portions respectively of the four sequences S'1 . . . S'4.

It is possible to verify that the efficiency of the ULP-interleaved procedure thus obtained, by applying standard rules to the novel concept of the invention, leads to a loss of efficiency as compared with the ELP-interleaved procedure. Specifically, denoting by p2 and p3 respectively the probabilities of losing two and three packets in the block B (p3<p2), and LSMj and LSM'j respectively the sizes of the segments SMj and SM'j:

the statistical gain of the ELP-interleaved as compared with the ULP-interleaved procedure is given by the product p3×LSM'1, since in the event of losing three packets, instead of losing all the segments of the block B, the first of size LSM'1 is retained;

however, the statistical loss is given by the product p2×LSM4, since in the event of losing two packets, instead of retaining all segments of block B, the fourth, of size, LSM4, is lost;

so that the balance equals: (p3×LSM'1−p2×LSM4), which is negative.

The finding of this example can be generalized, since the better protection of the upstream segments, of reduced size, is offset by the less good protection of the downstream segments, of increased size, and the losses of packets cause harm downstream which is not compensated for by the upstream security measures.

The device of the invention is therefore not only unexpected, but also surprising, since it runs counter to what would seem to be crippling for anybody exploring this path according to known methods. The embodiments mentioned hereinbelow and the detailed description will enable the reader to observe that the device of the invention can nevertheless make it possible to obtain substantial gains as compared with the ELP-interleaved procedure.

Preferably, the resynchronization indicators comprise resynchronization markers and/or image headers.

In a preferred form of embodiment, the insertion device also comprises a data interleaving unit, able to determine groups of data sequences and to form the packets by juxtaposing portions of these sequences.

The device of the invention is indeed especially tailored to the interleaving of data, which, as in the more traditional forms, can make it possible to considerably reduce the risks of joint losses both of useful information and of associated redundant information (hence the risks of irremediable losses), although the results set forth hereinabove might lead one to think the contrary.

The data interleaving is not however necessary and in a variant embodiment, the packets are formed sequentially from the data, making sure that the size of each segment and of each set of error correcting codes is greater than the size of the packets. This variant, which is simpler to implement, leads to lesser performance than that which can be obtained with interleaving.

In the embodiments with interleaving, the data interleaving unit is such that each of the sequences consists of one of the segments and of the set of error correcting codes which is associated with this segment. The possibilities of controlling the formation of the packets are thus enhanced and their implementation is made easier.

Two particularly beneficial forms of embodiment with this definition of the sequences are distinguished. According to the first form of interleaving, the data interleaving unit is capable of being such that:

for each of the groups of sequences, the sequences, the segments, the sets of codes, the packets and the portions of sequences have constant sizes respectively, and each of the packets associated with this group of sequences is formed by juxtaposing portions of all the sequences of this group respectively.

This embodiment, representing an unusual type of interleaving, makes it possible to overcome the difficulties mentioned above and to compound the advantages of interleaving and of variable levels of protection depending on the positions of the packets with respect to the resynchronization indicators. It is in fact observed that a significant improvement in efficiency can be obtained as compared with an ELP-interleaved technique. The success of this solution is explained in the following way: in each group of sequences which is used for interleavings, the FEC codes have a constant size. Thus, the losing of packets has uniform consequences on all the sequences of this group, and in this manner one avoids a harmful weakening of the protection of certain of the sequences. What is more, the variable protection level depending on the position with respect to the resynchronization indicators, this level being referred to the groups of sequences, reduces the risks of making data unutilizable through lack of synchronization. For simplicity, this embodiment will be designated as implementing "grouped protection".

Advantageously, the data interleaving unit is then such that for each of the data blocks, the segments included in all the groups of sequences comprising at least one of the sequences associated with this block, have a constant size.

This results in better control of the protection levels in each block, since the sizes of the sets of error correcting codes in each of the groups of sequences associated with this block represent exactly the proportion of error correcting codes.

According to the second form of interleaving in which each sequence consists of a segment and of the associated set of codes, the data interleaving unit is capable of being such that:

the segments, the packets and the portions have constant sizes respectively and the sets of error correcting codes and the sequences have variable sizes, the group of sequences consists of at least two subgroups of sequences, which subgroups are associated respectively with at least two successive data blocks, and each of the packets associated with this group of sequences is formed by juxtaposing portions of distinct sequences of this group respectively.

This embodiment also constitutes an unusual form of interleaving, with variable sizes of the sequences and joint allowance for several blocks in each group of sequences. Its success is explained by the constancy of the sizes of the data segments, despite the variable sizes of the sets of codes within the group, and by the potentialities of carrying over the constructions of ends of packets from one subgroup to the next. For simplicity, this embodiment will be designated as implementing a "temporal chaining". The insertion device preferably employs both of the above forms of interleaving.

Moreover, the data interleaving unit is advantageously capable of being such that at least one of the groups of sequences contains sequences associated with several of the successive data blocks and that each of the packets is formed by juxtaposing portions of sequences associated with all these blocks. This mode of interleaving can be combined with the first or the second forms mentioned above. For simplicity, this embodiment will be designated as implementing a "temporal interleaving".

It is particularly beneficial for the insertion device to have the capability of exercising several of the modes of interleaving set forth hereinabove, since it then becomes possible to tailor the interleaving strategy as a function of the streams considered and of the specificities of the network. Thus, in a preferred implementation, the block sizes are partitioned into three intervals respectively defining blocks of "small", "medium" and "large" sizes. The limits of these intervals are chosen in particular as a function of the size of the packets (dependant on the specificities of the network), of the number of segments of each block (dependant in particular on the processing capabilities in respect of coding and decoding) and of the levels of protection implemented. The following interleaving procedures are then associated with each of the intervals:

large size blocks: first form of interleaving (grouped protection) without temporal interleaving;

medium size blocks: second form of interleaving (temporal chaining) without temporal interleaving;

and small size blocks: first form of interleaving (grouped protection) with temporal interleaving.

This implementation affords a simplicity of loading ("payload") for the large sizes, avoids temporal interleaving for the medium sizes and avoids overly complex headers for the small sizes. In variant implementations, only two intervals of block sizes are defined instead of three, by associating them respectively with two of the techniques mentioned. Advantageously, the interleaving unit comprises means for automatically selecting the interleaving procedures as a function of the size of the blocks (that is to say as a function of the periodicity of the resynchronization indicators).

Preferably, since each sequence consists of a segment and of the associated set of error correcting codes, the insertion device also comprises a unit for calculating sizes, which unit is designed to calculate the sizes of the sets of error correcting codes in relation to the sizes of the corresponding segments, as a function of an estimate of an updated loss model of the network, advantageously by means of data contained in reports according to the RTCP (standing for Real-Time Control Protocol) protocol.

Thus, the size parameters of the code sets can be utilized in an especially efficient manner by tailoring in particular the scheme for decreasing the level of protection between the consecutive resynchronization indicators.

Advantageously:

the insertion device also comprises a unit for recognizing types of data, the unit for determining segments is able to establish the segments according to these types of data and and the unit for allocating codes is designed to weight the sizes of the sets of error correcting codes as a function of the types of data of the segments corresponding to these sets.

The efficiency of the procedure is thus enhanced by combining it with traditional ULP-interleaved techniques. In practice, this embodiment amounts to applying the position-dependent variable protection procedure to each of the types of data separately. These types of data are then preferably chosen from among the following elements of compressed digital video data:

I, P or B type images;

header, motion vector or texture type partition entities;

and/or base layer or optional enhancement layer type layers.

The invention also relates to a method for inserting error correcting codes into at least one data stream intended to be sent as packets in a network. Each of the data streams includes reference resynchronization indicators dispersed in this stream and the data lying between any two of the consecutive resynchronization indicators constitute a data block. The device for inserting codes comprises the following steps:

determining successive data segments in the streams, and allocating a set of error correcting codes to each of these segments, these sets of codes having variable sizes depending on the segments.

According to the invention, the insertion method also comprises a step for identifying the resynchronization indicators, and the data segments are determined by performing partitions of the data blocks and decreasing sizes are assigned to the sets of codes between any two of the consecutive resynchronization indicators.

This method is preferably implemented by means of the insertion device according to any one of the embodiments of the invention.

The invention applies moreover to a digital signal relating to at least one data stream. Each of these data streams includes reference resynchronization indicators dispersed in this stream, the data lying between any two of the consecutive resynchronization indicators constituting a data block. The digital signal comprises information representative of successive data segments in the streams and of sets of error correcting codes respectively allocated to the segments, these sets of codes having variable sizes depending on the segments.

According to the invention, the data segments form partitions of the data blocks and the sets of codes have decreasing sizes between any two of the consecutive resynchronization indicators.

This digital signal is preferably obtained by means of an insertion device according to any one of the embodiments of the invention.

The invention also pertains to a device for reconstructing data streams from digital signals received as packets originating from a network, these digital signals comprising information representative of successive data segments in the streams and of sets of error correcting codes respectively allocated to these segments. The reconstruction device comprises:

a unit for reconstructing the data segments of missing packets from information representative of data segments and of sets of error correcting codes for the packets received, this reconstruction unit being able to operate on sets of error correcting codes of variable sizes depending on the segments, a unit for ordering the data segments received and reconstructed, and a unit for synchronizing the data segments by means of reference resynchronization indicators contained in the packets.

According to the invention, the reconstruction unit is designed to operate on sets of error correcting codes of decreasing size between any two of the reference resynchronization indicators.

This reconstruction device is preferably designed to reconstruct signals in accordance with the signal of the invention.

The invention also relates to a method for reconstructing data streams from digital signals received as packets originating from a network, these digital signals comprising information representative of successive data segments in the streams and of sets of error correcting codes respectively allocated to the segments, and these sets of codes having variable sizes depending on the segments. The reconstruction method comprises the following steps:

reconstructing the data segments of missing packets from information representative of data segments and of sets of error correcting codes for the packets received, ordering the data segments received and reconstructed, and synchronizing the data segments by means of reference resynchronization indicators contained in the packets.

According to the invention, the data streams are reconstructed from sets of error correcting codes of decreasing size between any two of the consecutive resynchronization indicators.

This reconstruction method is preferably implemented by means of a reconstruction device in accordance with the invention.

The subject of the invention is also a computer program product comprising program code instructions for executing the steps of the method for inserting error correcting codes or the method for reconstructing data streams according to the invention when this program is executed on a computer.

The expression "computer program product" is understood to mean any medium for this program, be it of hardware type (disk, diskette, cassette, etc.) or in the form of a signal (electronic, electromagnetic, optical signal, etc.).

BRIEF DESCRIPTION OF THE DRAWINGS

The invention will be better understood and illustrated by means of the following exemplary embodiments and implementations, which are no way limiting, with reference to the appended figures in which:

In FIG. 3, the entities represented in the form of blocks are purely functional, and therefore do not necessarily correspond to physical entities.

DESCRIPTION OF THE PREFERRED EMBODIMENTS

Figure 3:
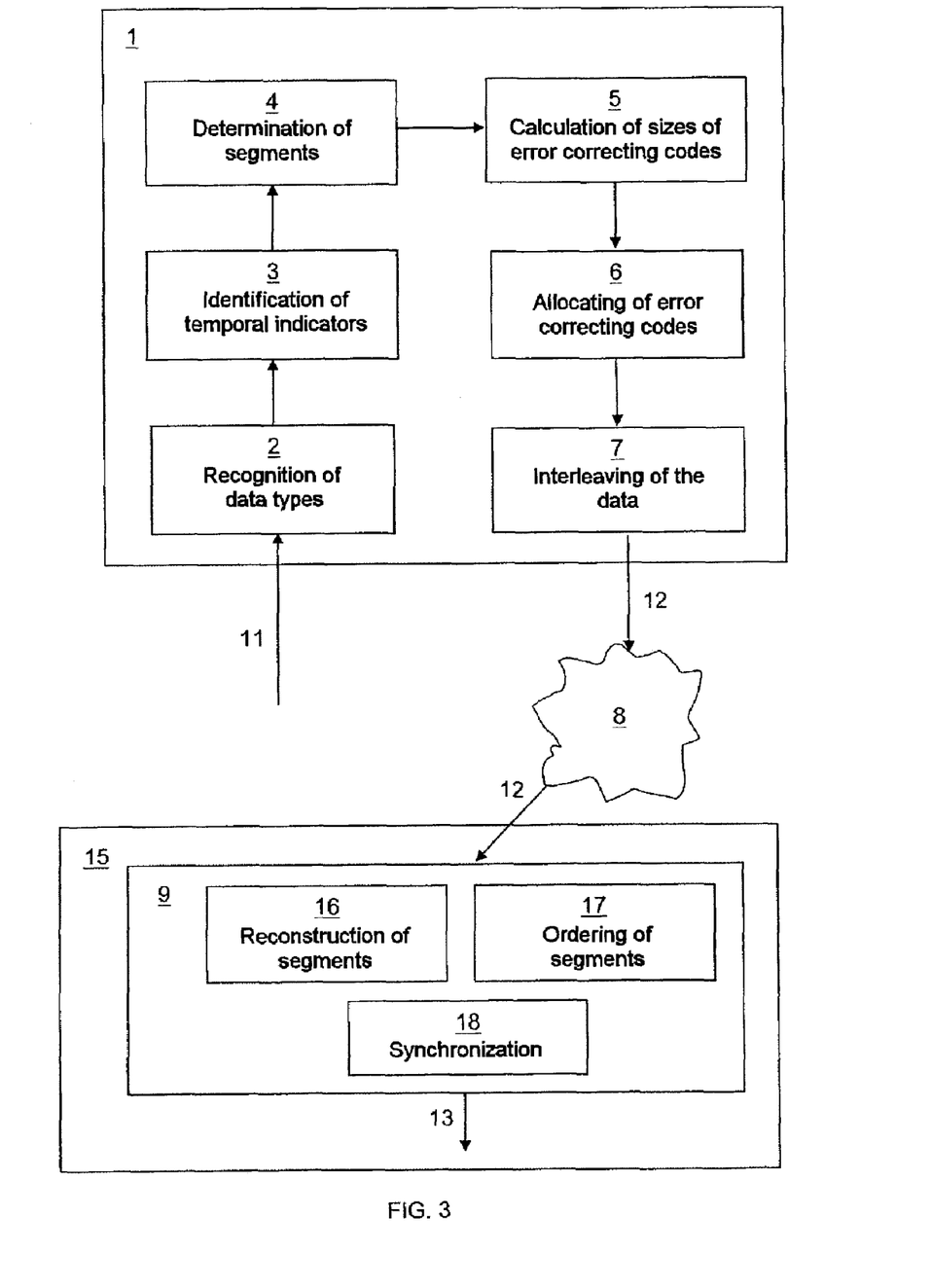
FIG. 3 is a block diagram representing a device for inserting error correcting codes and a device for reconstructing streams in accordance with the invention, communicating through a network.

A device 1 for inserting FEC codes of a transmitter is designed to receive a data stream 11—or several multiplexed streams—and to produce from this stream 11, a stream 12 comprising data protection FEC codes transmitted in the form of packets P in a communication network 8, such as the Internet for example.

A device 9 for reconstructing streams of a receiver 15, associated with the insertion device 1, is designed to receive the stream 12 and to produce a data stream 13, in which the missing data are if possible reconstructed by means of the FEC codes by a segment reconstruction unit 16, and the information is ordered and synchronized, respectively by a segments ordering unit 17 and a synchronization unit 18.

The insertion device 1 comprises:

a unit 2 for recognizing the types of data of the stream 11 received; these types of data consist for example of the types of video images (I, P or B image), the types of partition data (headers, motion vectors or texture) and/or the types of coding extension (base layer or optional enhancement layers);

a unit 3 for identifying resynchronization indicators, image headers or resynchronization markers, dispersed in the incoming stream 12; the data lying between two consecutive resynchronization indicators form a block;

a unit 4 for determining segments, which is designed to define consecutive segments SM in the stream 12 by performing partitions of the data blocks B;

a unit 5 for calculating sizes of sets of FEC codes (denoted "FEC" generically) to be assigned respectively to the segments SM; these sizes are calculated as a function of the estimation of a model of loss of the network 8, for example by means of data contained in the RTCP reports;

a unit 6 for respectively allocating the sets of FEC codes to the segments SM, as a function of the results produced by the calculation unit 5;

and a unit 7 for interleaving the data.

The units 16, 17 and 18 of the reconstruction device 9 are adapted to the operational modes of the insertion device 1. The latter introduces for example processing indicators at the head of the stream 12, indicating the interleaving technique used, as well as the sizes of the packets P, of the segments SM and of the sets of FEC codes associated with these segments SM.

In a generic manner in respect of the following account, we define sequences S respectively as the unions of the segments SM and of the associated FEC sets, and groups G of sequences which are used in isolation to form packets P by data interleaving.

The data interleaving unit 7 is able to implement several modes of interleaving. According to one of them (grouped protection, FIG. 4), it defines several groups G1–G4 (denoted G generically for all the embodiments) of data sequences for each block B (cf. FIGS. 1A and 1B). These groups G1–G4 consist respectively of groups GSM1–GSM4 of segments and of groups GFEC1–GFEC4 of sets of associated FEC codes. Each of them contains a succession of segments of the relevant block B, of uniform size for all the groups G1–G4, and the totality of segments forms a partition of this block B. The groups Gi are thus ordered as a function of the successive positions of the segments between the resynchronization indicators $RM_i$ and $RM_{i+1}$ upstream and downstream of the block B.

Figure 4:
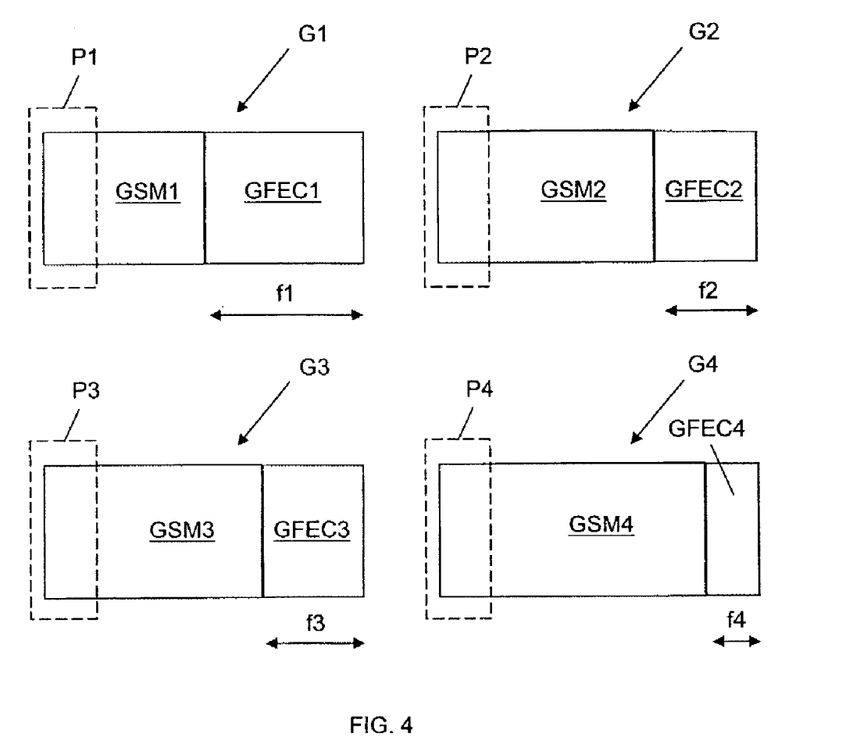
FIG. 4 represents four groups of sequences which are used by the insertion device of FIG. 3 for the application of a first interleaving technique with FEC codes of variable sizes depending on the positions of the data with respect to resynchronization indicators (technique of the grouped protection type)

Moreover, with each group Gi is associated a unique size fi of the sets of FEC codes (with i=1, 2 . . . 4 in the example), and the groups G1–G4 have sizes f1–f4 of these sets of codes which decrease with the order of these groups (decrease possibly signifying stationarity over certain parts). These sizes fi give the proportions of FEC codes as a function of the positions of the segments in the block B.

When operational, the interleaving unit 7 forms packets Pi for each group Gi respectively, by extracting a portion of each of the sequences of the group Gi for each of these packets Pi. The packets Pi are thus constructed transversely with respect to the sequences of groups Gi.

The efficiency of this procedure for packets of sufficiently large size has been demonstrated in a simple example, in which each block is segmented into four segments of five packets each (20 data packets). The overall rate of FEC protection equals 40%, i.e. 8 FEC packets for the 20 data packets of each block.

With the conventional ELP-interleaved procedure, two FEC packets are associated with each of the four segments. Moreover, the above grouped protection procedure is applied, by adapting the distribution of the sizes f1–f4, respectively associated with each of the segments, of FEC codes (that is to say the number of FEC packets) to the error rate.

The distribution of the FEC packets and the efficiency obtained, measured as the average size, relative to the maximum size, of data which can be used by the receiver 15, are set forth as a function of the loss rate (as a percentage) in Tables 1 and 2, relating respectively to a Gaussian loss model and to a two-state Markov loss model.

Figure 5:
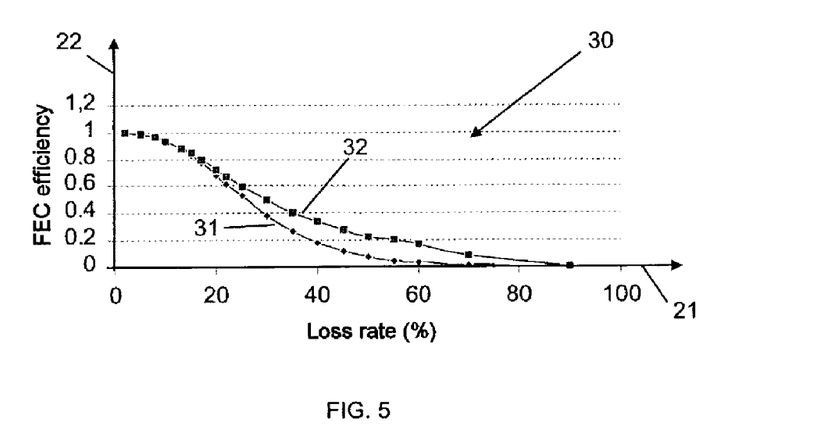
FIG. 5 gives the compared efficiencies of the FEC protection (medium size, relative to the complete size, of data which can be used by a receiver) as a function of the error rates, these efficiencies being obtained respectively by a conventional ELP-interleaved procedure and by the technique of FIG. 4, with a Gaussian loss model.
Figure 6:
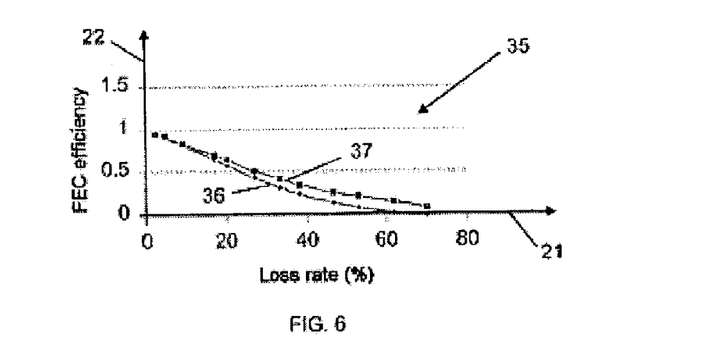
FIG. 6 gives the compared efficiencies of the FEC protection (medium size, relative to the complete size, of data which can be used by a receiver) as a function of the error rates, these efficiencies being obtained respectively by a conventional ELP-interleaved procedure and by the technique of FIG. 4, with a two-state Markov loss model (q=0.6)

Moreover, the curves giving the FEC efficiency (axis 22) as a function of the loss rate (axis 21) have been represented (FIGS. 5 and 6) for these two models (representations 30 and 35). It is observed that for the Gaussian loss model and the Markov loss model respectively, the curves 32 and 37 obtained by the grouped protection procedure are systematically above the curves 31 and 36 obtained by the ELP-interleaved procedure, appreciably for certain loss rates.

TABLE 1

Efficiency and FEC distribution for Gaussian model

| Loss rate (%) | ELP (2,2,2,2) | Grouped protection | Distribution of FEC codes |
|---|---|---|---|
| 2 | 0.99955 | 0.99955 | (2,2,2,2) |
| 5 | 0.9904 | 0.9904 | (2,2,2,2) |
| 8 | 0.963025 | 0.963025 | (2,2,2,2) |

TABLE 1-continued

Efficiency and FEC distribution for Gaussian model

| Loss rate (%) | ELP (2,2,2,2) | Grouped protection | Distribution of FEC codes |
|---|---|---|---|
| 10 | 0.9367 | 0.9367 | (2,2,2,2) |
| 13 | 0.87825 | 0.88655 | (3,2,2,1) |
| 15 | 0.82765 | 0.847425 | (3,2,2,1) |
| 17 | 0.771625 | 0.7989 | (3,2,2,1) |
| 20 | 0.677925 | 0.722225 | (3,2,2,1) |
| 22 | 0.61685 | 0.6693 | (3,2,2,1) |
| 25 | 0.5265 | 0.598775 | (3,3,2,0) |
| 30 | 0.382475 | 0.498675 | (4,3,1,0) |
| 35 | 0.264225 | 0.406625 | (5,3,0,0) |
| 40 | 0.17725 | 0.34335 | (5,3,0,0) |
| 45 | 0.1158 | 0.2797 | (6,2,0,0) |
| 50 | 0.072325 | 0.224675 | (7,1,0,0) |
| 55 | 0.045075 | 0.1982 | (8,0,0,0) |
| 60 | 0.0276 | 0.16475 | (8,0,0,0) |
| 70 | 0.007125 | 0.086575 | (8,0,0,0) |
| 90 | 0.000075 | 0.00155 | (8,0,0,0) |

TABLE 2

Efficiency and FEC distribution for Markov model

| Loss rate (%) | ELP (2,2,2,2) | Grouped protection | FEC Distribution | (p,q) |
|---|---|---|---|---|
| 2.5 | 0.95085 | 0.957475 | (3,3,2,0) | (0.01; 0.6) |
| 4.8 | 0.905275 | 0.916625 | (4,2,2,0) | (0.02; 0.6) |
| 9.3 | 0.81125 | 0.83785 | (4,2,2,0) | (0.04; 0.6) |
| 17 | 0.64825 | 0.694725 | (5,2,1,0) | (0.08; 0.6) |
| 20.2 | 0.578075 | 0.6314 | (5,2,1,0) | (0.1; 0.6) |
| 27.3 | 0.430425 | 0.50245 | (4,3,1,0) | (0.15; 0.6) |
| 33.4 | 0.3182 | 0.413475 | (5,2,1,0) | (0.2; 0.6) |
| 38.3 | 0.238125 | 0.3472 | (5,3,0,0) | (0.25; 0.6) |
| 46.8 | 0.1291 | 0.25725 | (6,2,0,0) | (0.35; 0.6) |
| 53 | 0.070725 | 0.20515 | (8,0,0,0) | (0.45; 0.6) |
| 62 | 0.01845 | 0.151475 | (8,0,0,0) | (0.85; 0.6) |
| 70.3 | 0.000275 | 0.072975 | (8,0,0,0) | (0.95; 0.6) |

In another mode of interleaving (grouped protection with temporal interleaving, FIG. 7), the interleaving unit 7 builds each group G of sequences, such as G10, G20, G30 and G40, from several segments SM of consecutive blocks lying at similar locations in each of these blocks. For example, the first group G10 contains the first segments (groups of segments SM1-1, SM1-2, SM1-3 and SM1-4) respectively of four consecutive blocks, as well as the sets of associated FEC codes (group FEC10). Similarly, blocks G20, G30 and G40 each contain respectively four groups of segments SM2-j, SM3-j and SM4-j (with j=1 . . . 4) at similar locations of these four blocks, as well as the groups of sets FEC20, FEC30 and FEC40 of associated FEC codes.

Figure 7:
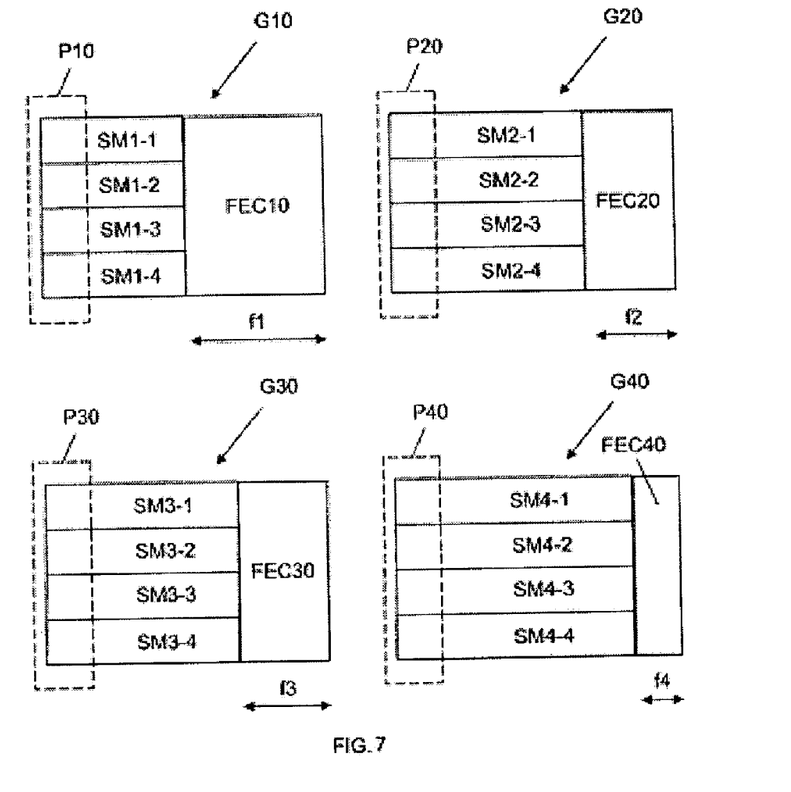
FIG. 7 represents four groups of sequences which are used by the insertion device of FIG. 3 for the application of a second interleaving technique with FEC codes of variable sizes depending on the positions of the data with respect to resynchronization indicators (technique of the grouped protection with temporal interleaving type)

In each of the groups G, the FEC sets have a constant size (respectively f1, f2, f3 and f4 for the groups G10, G20, G30 and G40 of the example), and the segments SM of the various groups G all have the same size.

When operational, the interleaving unit 7 forms packets P10, P20, P30 and P40 respectively for the groups G10, G20, G30 and G40, by extracting transversely a portion of each of the sequences of the group G (just as for the simple group protection) for each of these packets P. This temporal interleaving procedure is particularly tailored for packets of small size, in particular when the size of the segments SM is much less than the critical size MTU_size.

Figure 8:
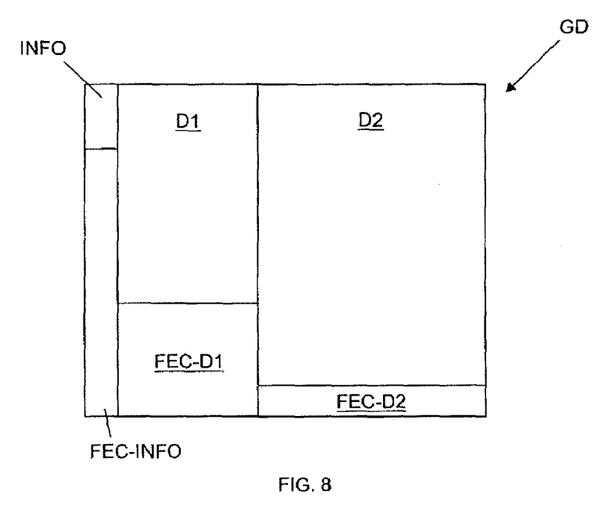
FIG. 8 shows a group of data of various types with associated FEC codes, which is used by the insertion device of FIG. 3 in combination with one of the interleaving techniques illustrated in FIGS. 4 or 7.

The interleaving unit 7 makes it possible to combine one or the other of the above procedures with a traditional ULP-interleaved technique, by using the information given by the unit 2 for recognizing data types. To do this, it applies the selected interleaving procedure to each type of data separately. For example (FIG. 8), it defines a group GD of sequences S of data by distinguishing data INFO of information type, of type D1 and of type D2, and by respectively associating coefficients FEC-INFO, FEC-D1 and FEC-D2 of FEC codes with these three types of data. Each of these coefficients subsequently serves to weight for the associated type of data, the FEC codes used according to the procedures set forth hereinabove.

In yet another mode of interleaving (temporal chaining, FIG. 9) which may also be combined with the ULP-interleaved procedure based on data type, the interleaving unit 7 constructs each group G of sequences on the basis of at least two blocks, but while making provision to form the packets P from extracted specimens associated with several of these blocks only during transitions from one block to the next (in contradistinction to temporal interleaving).

Figure 9:
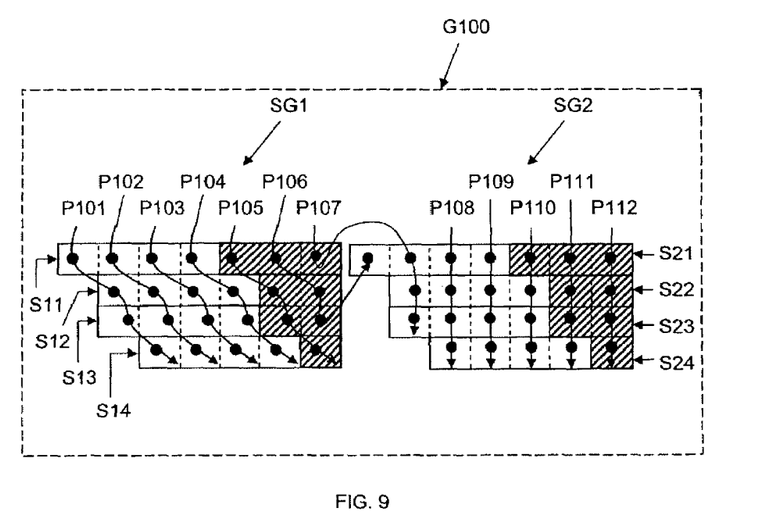
FIG. 9 represents a group of sequences which is composed of two subgroups and is used by the insertion device of FIG. 3 for the application of a third interleaving technique with FEC codes of variable sizes depending on the positions of the data with respect to resynchronization indicators (technique of the temporal chaining type).

Thus, for example, the group G100 of sequences contains two subgroups SG1 and SG2 respectively associated with two consecutive blocks and formed in a similar manner—same number of sequences S, same sizes of the segments SM and of the FEC sets for both subgroups. Moreover, the segments SM have a constant size for the whole of the group G100, whilst the FEC sets have a variable size, decreasing between the upstream and downstream resynchronization indicators for each block. Thus, in the example illustrated, the subgroups SG1 and SG2 respectively comprise four sequences S11–S14 and S21–S24, the segments SM have a uniform size of four "portions" each and the FEC sets have a decrease scheme 3-2-2-1 (in terms of number of portions) associated with each block. The subgroups SG1 and SG2 thus have an identical shape, of the trapezoidal type with wide upper base.

On the other hand, the modes for forming the packets P are dissymmetric from one subgroup SG1 to the other SG2, and involve transition links between the subgroups while ensuring a constant size of these packets P (in this instance, four portions). More precisely, in the first subgroup SG1, the first packet P101 is formed by extracting the first portion from each of the sequences S11-S14. In a similar manner, the interleaving unit 7 constructs each of the following packets P102–P105 by respectively extracting, from all the sequences S11–S14 of the subgroup SG1, corresponding portions, firstly of the segments SM (packets P102 to P104), and then of the FEC sets (packet P105).

When this mode of extraction is no longer possible since the portions of the last sequence S14 are exhausted, the interleaving unit 7 completes the packet P106 currently being formed by extracting the missing portion from the first sequence S21 of the second subgroup SG2. In a similar manner, the next packet P107 initiated with the last portion of the first sequence S11, is completed by extracting the three missing portions respectively from the first three sequences S21–S23 of the subgroup SG2. The following packets P108–P112 are constructed entirely in the subgroup SG2, by extracting successive portions respectively from its four sequences S21–S24.

In contradistinction to what would be obtained by applying the traditional ULP procedure, the construction scheme makes it possible to benefit as compared with the ELP-interleaved procedure from increased protection in respect of the upstream data in the blocks, without the losing of packets giving rise to a significant increase in irremediable losses in the data downstream. This procedure allows the processing of medium size packets without resorting to temporal interleaving.

The particular configuration described in the example permits a periodicity over two blocks. However, in other embodiments, the periodicity is obtained over three or more blocks. More precisely, the number of blocks involved depends on the number of missing portions for ensuring the complete formation of all the packets of like size in a subgroup of sequences, by extracting portions from distinct sequences for each packet.

The interleaving unit 7 of the insertion device 1 described by way of example has the capability of implementing any one of the strategies detailed above. The technique adopted can be defined by whoever is responsible for the transmission, or be selected automatically by the insertion device 1 as a function in particular of the size of the packets P.

The invention claimed is:

1. Device for inserting error correcting codes into at least one data stream intended to be sent as packets in a network, each of said streams including reference resynchronization indicators dispersed in said stream and the data lying between any two of said consecutive resynchronization indicators constituting a data block, said device for inserting codes comprising: a unit for determining successive data segments in said streams, and a unit for allocating a set of error correcting codes to each of said segments, said sets of codes having variable sizes depending on said segments, characterized in that said insertion device also comprises a unit for identifying said resynchronization indicators, and in that the unit for determining segments is designed to determine the segments by performing partitions of said data blocks and in that the allocating unit is designed to assign decreasing sizes to said sets of codes between any two of said consecutive resynchronization indicators.

2. Insertion device according to claim 1, characterized in that said resynchronization indicators comprise resynchronization markers.

3. Insertion device according to claim 1, characterized in that said resynchronization indicators comprise image headers.

4. Insertion device according to claim 1, characterized in that it also comprises a data interleaving unit, able to determine groups of data sequences and to form said packets by juxtaposing portions of said sequences.

5. Insertion device according to claim 4, characterized in that the data interleaving unit is such that each of the sequences consists of one of the segments and of the set of error correcting codes which is associated with said segment.

6. Insertion device according to claim 5, characterized in that the data interleaving unit is capable of being such that: for each of said groups of sequences, said sequences, said segments, said sets of codes, said packets and said portions of sequences have constant sizes respectively, and each of said packets associated with said group of sequences is formed by juxtaposing portions of all said sequences of said group respectively.

7. Insertion device according to claim 6, characterized in that the data interleaving unit is such that for each of said data blocks, said segments included in all the groups of sequences comprising at least one of the sequences associated with said block, have a constant size.

8. Insertion device according to claim 5, characterized in that the data interleaving unit is capable of being such that: said segments, said packets and said portions have constant sizes respectively and said sets of error correcting codes and said sequences have variable sizes, said group of sequences consists of at least two subgroups of sequences, which subgroups are associated respectively with at least two successive data blocks, and each of said packets associated with said group of sequences is formed by juxtaposing portions of distinct sequences of said group respectively.

9. Insertion device according to claim 4, characterized in that the data interleaving unit is capable of being such that at least one of the groups of sequences contains sequences associated with several of said successive data blocks and in that each of said packets is formed by juxtaposing portions of sequences associated with all said blocks.

10. Insertion device according to claim 1, characterized in that it also comprises a unit for calculating sizes, which unit is designed to calculate the sizes of the sets of error correcting codes in relation to the sizes of the corresponding segments, as a function of an estimate of an updated loss model of said network, advantageously by means of data contained in reports according to the RTCP protocol.

11. Insertion device according to claim 1, characterized in that it also comprises a unit for recognizing types of data, in that the unit for determining segments is able to establish the segments according to said types of data and in that the unit for allocating codes is designed to weight the sizes of the sets of error correcting codes as a function of said types of data of the segments corresponding to said sets.

12. Insertion device according to claim 11, characterized in that said types of data are chosen from among the following elements of compressed digital video data: I, P or B type images; header, motion vector or texture type partition entities; and/or base layer or optional enhancement layer type layers.

13. Method for inserting error correcting codes into at least one data stream intended to be sent as packets in a network, each of said streams including reference resynchronization indicators dispersed in said stream and the data lying between any two of said consecutive resynchronization indicators constituting a data block, said method for inserting codes comprising the following steps: determining successive data segments in said streams, and allocating a set of error correcting codes to each of said segments, said sets of codes having variable sizes depending on said segments, characterized in that said insertion method also comprises a step for identifying said resynchronization indicators, and in that the data segments are determined by performing partitions of said data blocks and in that decreasing sizes are assigned to said sets of codes between any two of said consecutive resynchronization indicators.

14. Device for reconstructing data streams from digital signals received as packets originating from a network, said digital signals comprising information representative of successive data segments in said streams and of sets of error correcting codes respectively allocated to said segments, said reconstruction device comprising: a unit for reconstructing the data segments of missing packets from information representative of data segments and of sets of error correcting codes for the packets received, said reconstruction unit being able to operate on sets of error correcting codes of variable sizes depending on said segments, a unit for ordering the data segments received and reconstructed, and a unit for synchronizing said data segments by means of reference resynchronization indicators contained in said packets, characterized in that said reconstruction unit is designed to operate on sets of error correcting codes of decreasing size between any two of said reference resynchronization indicators.

15. Method for reconstructing data streams from digital signals received as packets originating from a network, said digital signals comprising information representative of successive data segments in said streams and of sets of error correcting codes respectively allocated to said segments, and said sets of codes having variable sizes depending on said segments, said reconstruction method comprising the following steps: reconstructing the data segments of missing packets from information representative of data segments and of sets of error correcting codes for the packets received, ordering the data segments received and reconstructed, and synchronizing said data segments by means of reference resynchronization indicators contained in said packets, characterized in that said data streams are reconstructed from sets of error correcting codes of decreasing size. between any two of said reference resynchronization indicators.

* * * * *